United States Patent
Maegawa et al.

(10) Patent No.: US 6,269,253 B1
(45) Date of Patent: Jul. 31, 2001

(54) MULTI-MODE WIRELESS COMMUNICATION SYSTEM

(75) Inventors: Takaaki Maegawa, Sakurai; Hiroyuki Nakamura, Neyagawa; Makoto Sakakura, Uji; Hiroaki Kosugi, Hirakata; Junichi Takada, Kamakura, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/162,210

(22) Filed: Sep. 28, 1998

(30) Foreign Application Priority Data

Sep. 26, 1997 (JP) .................................................... 9-262466

(51) Int. Cl.[7] .................................................... H04B 1/38
(52) U.S. Cl. .................... 455/552; 455/553; 455/255; 455/76; 455/118
(58) Field of Search ................................ 455/76, 553, 86, 455/118, 120, 150.1, 84, 552, 180.1, 112, 188.1, 258, 255, 259; 375/216

(56) References Cited

U.S. PATENT DOCUMENTS 5,152,005 * 9/1992 Bickley .................................. 455/76
5,239,689 * 8/1993 Fukuda .................................. 455/86
5,535,432 * 7/1996 Dent ...................................... 455/77
5,732,330 * 3/1998 Anderson et al. ..................... 455/76
5,794,302 * 10/1999 Adamiecki et al. ................... 455/76
5,819,161 * 10/1998 Saito ..................................... 455/86
5,896,562 * 4/1999 Heihonen .............................. 455/76
5,953,641 * 9/1999 Auvray ................................. 455/74
5,974,305 * 10/1999 Matero .............................. 455/188.1
6,163,710 * 12/2000 Blaser et al. ........................ 455/552

\* cited by examiner

Primary Examiner—Dwayne Bost
Assistant Examiner—Sonny Trinh
(74) Attorney, Agent, or Firm—Ratner & Prestia

(57) ABSTRACT

A multi-mode wireless system having a modulator (11) for modulating two system signals (low frequency signals for the GSM system and high frequency signals for the DCS1800 system), a first local oscillator (14) for oscillating a signal of a predetermined frequency, a n-divider (15) for dividing a signal from the first local oscillator by a factor of n, a high frequency mixer (13) for converting a signal to a high frequency side output (17) according to a signal output from the first local oscillator (14) and a signal output from the modulator (11), and a low frequency mixer (12) for outputting a signal to a low frequency mixer (16) according to an n-divided signal and a signal from the modulator (11).

13 Claims, 5 Drawing Sheets

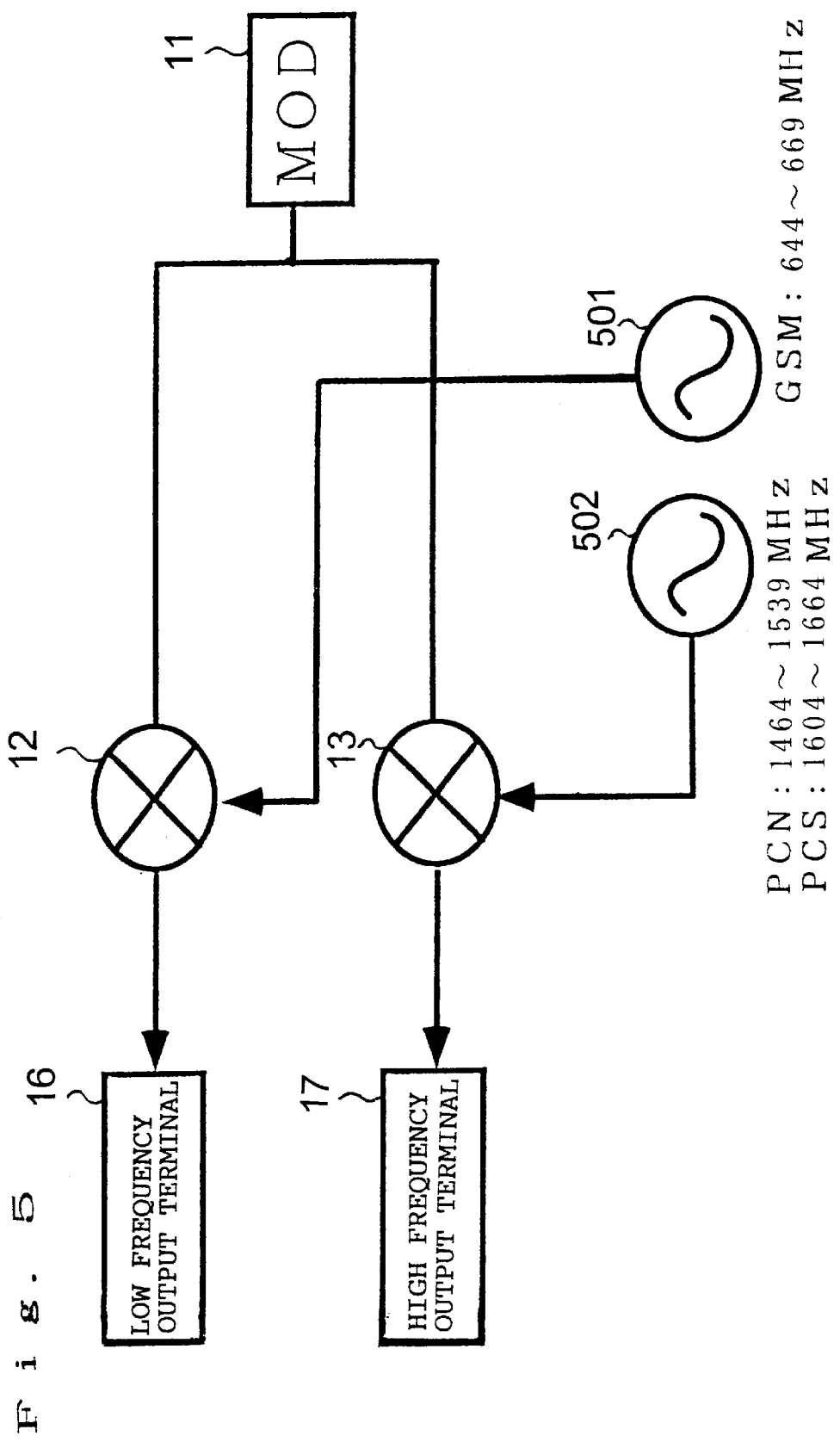

MULTI-MODE WIRELESS COMMUNICATION SYSTEM

BACKGROUND OF THE INVENTION

1. Field of the Invention

The present invention relates to a wireless telegraph usable for a plurality of different communication systems in a mobile digital communication portable terminal.

2. Description of the Related Art

Hereunder, description will be made for both configuration and operation of a wireless telegraph used in a related art portable telephone. The wireless telegraph is divided into a transmitter and a receiver in the description.

At first, the transmitter of the related art portable telephone will be described.

In the transmitter, signals I and Q are entered to an input terminal of a signal modulator that can modulate a plurality of different signals. Passing the signal modulator, the frequencies of both the signals I and Q are changed in a multiplying circuit of a mixer according to a signal output from the first local oscillator.

After this, the signals I and Q pass a transmission band-pass filter, so that only a desired frequency is amplified in a power amplifier. The frequency-amplified signal then passes an antenna switch, so that only a desired signal is output from an antenna terminal.

Next, the receiver of the related art portable telephone will be described.

At first, the receiver receives a desired signal via the antenna terminal. Then, the received signal passes the antenna switch and a receiving band-pass filter, so that the received signal is amplified by a low noise power amplifier.

After this, the frequency of the received signal is changed by a multiplying circuit of a receiving mixer. Then, the received signal passes the second receiving band-pass filter that passes lower frequencies than the receiving band-pass filter. The frequency of the received signal is then changed using a frequency from the second local oscillator. After this, the received signal passes the third receiving band-pass filter, so that the received signals I and Q are demodulated with two types of phase signals.

On the other hand, there have been many types of portable telephone service communication systems. For example, the GSM system is used widely in Europe and the PDC and PHS systems are used widely in Japan, etc.

When using each of those communication systems, therefore, the user must prepare portable telephones as many as the number of communication systems to be used. There has been no compact and light-weight portable telephone that can correspond to such a plurality of communication systems.

If the configuration of the related art portable telephone is used as is for services of a plurality of communication systems, the number of parts in such a portable telephone will become double those of a portable telephone for a single communication system even in a rough estimation. And, the size of the portable telephone itself will become about double and accordingly, the telephone will become more heavy.

Furthermore, in order to meet the above prerequisites, it is needed to develop and mount devices such as a wide-ranged oscillator, a mixer, each band-pass filter, an amplifier, etc. that are usable commonly for the frequency configuration of each of those communication systems. In addition, each of those devices must be reduced much more in both size and weight. Otherwise, they are not usable for such a compact and light-weight portable telephone. The related art portable telephone has been confronted with such problems.

SUMMARY OF THE INVENTION

Under such the circumstances, it is an object of the present invention to provide a wireless telegraph that can solve the above related art problems and correspond to a plurality of communication systems while satisfying the wide range prerequisite of each of the devices, as well as it is possible to be reduced significantly in both size and weight.

The first aspect of the present invention is a wireless telegraph corresponding to a plurality communication systems, comprising means for modulating signals of a plurality of communication systems; means for oscillating a signal of a predetermined frequency; means for dividing a signal from said oscillating means by a factor of N; and a mixer for entering a signal output from said oscillating means or said N-divided signal and a signal from said modulating means, then outputting a signal of a predetermined frequency.

The second aspect of the present invention is a wireless telegraph corresponding to a plurality communication systems, comprising means for modulating I and Q signals of a plurality of communication systems; first means for oscillating a signal of a predetermined frequency; variable dividing means that can vary its dividing number according to each of a plurality of said communication systems; a mixer for entering said divided signal and a signal output from said modulating means, then outputting a signal of a predetermined frequency; a transmission band-pass filter for passing a signal of said predetermined frequency; a transmission amplifier for amplifying a transmission frequency signal that has passed said transmission band-pass filter; first receiving band-pass filter for passing a received signal; a receiving amplifier for amplifying a received signal that has passed said first receiving band-pass filter; first receiving mixer for entering said amplified received signal and a signal output from said first oscillating means, then outputting first intermediate frequency signal; and second receiving band-pass filter for passing a signal from said first receiving mixer.

A further aspect of the invention of the present invention is a wireless telegraph corresponding to two transmission frequencies, wherein first frequency is double or around double second frequency, comprising first local oscillator for oscillating a signal of first local frequency; a P-divider for dividing said first local frequency signal by a factor of P; second local oscillator for oscillating a signal of second local frequency; a Q-divider for dividing said second local frequency signal by a factor of Q; first mixer for entering said first and second local frequency signals and outputting a signal of said first frequency; and second mixer for entering said P-divided first local frequency signal and said Q-divided second local frequency signal and outputting said second frequency signal.

BRIEF DESCRIPTION OF THE DRAWINGS

FIG. 5 is a configuration of the wireless telegraph in the second embodiment in comparison with another wireless telegraph.

Figure 1:
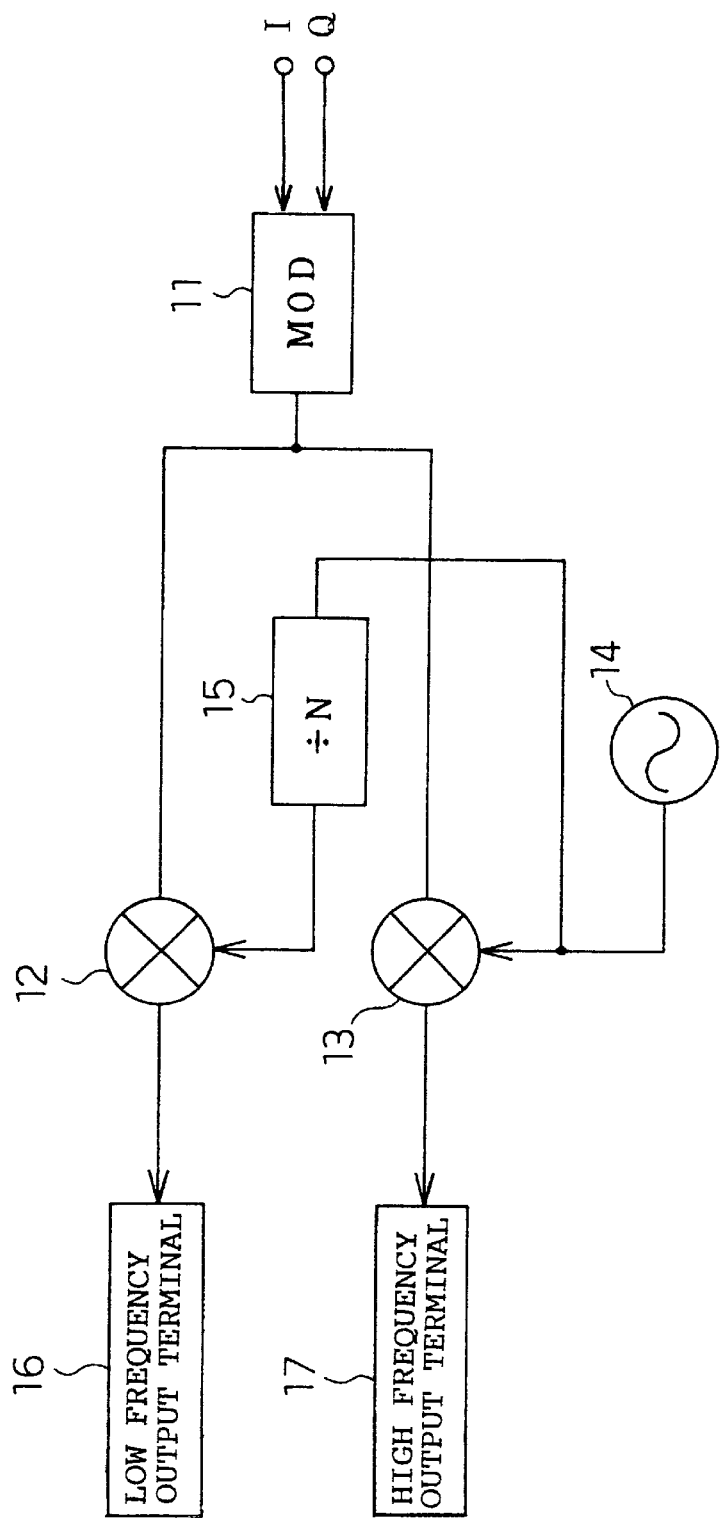
FIG. 1 is a block diagram for the portion around a transmission mixer provided in a dual mode wireless telegraph corresponding to a plurality of communication systems in the first embodiment of the present invention.

DESCRIPTION OF THE REFERENCE NUMERALS 11, 21 . . . MODULATOR
12, 42 . . . LOW FREQUENCY MIXER
13, 43 . . . HIGH FREQUENCY MIXER
14, 24, 44 . . . FIRST LOCAL OSCILLATOR
15 . . . N-DIVIDER
16, 46 . . . LOW FREQUENCY OUTPUT PART (OUTPUT TERMINAL)
17, 47 . . . HIGH FREQUENCY OUTPUT PART (OUTPUT TERMINAL)
22 . . . MIXER
25 . . . N-DIVIDER
26 . . . LAMINATED PLANER (TRANSMISSION)
27 . . . POWER AMPLIFIER
28 . . . ANTENNA SWITCH
29 . . . ANTENNA
30 . . . LAMINATED PLANER (RECEIVING)
31 . . . LOW NOISE POWER AMPLIFIER (LNA)
32 . . . FIRST MIXER (RECEIVING)
33 . . . SAW FILTER
34, 50 . . . SECOND LOCAL OSCILLATOR
35, 51 . . . SECOND MIXER (RECEIVING)
36 . . . CERAMIC FILTER
37, 52 . . . VOLTAGE-CONTROLLED OSCILLATOR WITH TEMPERATURE COMPENSATION
38 . . . DEMODULATOR
45 . . . P-DIVIDER
49 . . . Q-DIVIDER
62 . . . DIVIDER

DESCRIPTION OF THE PREFERRED EMBODIMENTS

Hereunder, the preferred embodiments of the present invention will be described with reference to the accompanying drawings.
(First Embodiment)

FIG. 1 is a block diagram for the portion around a transmission mixer provided in a dual mode wireless telegraph corresponding to a plurality of communication systems in the first embodiment of the present invention. In this embodiment, the transmitter of portable telephone services will be described.

In FIG. 1, signals I and Q are entered to an input terminal of a modulator 11 that can modulate a plurality of communication signals as transmit signals. Passing the modulator 11, the frequencies of the signals I and Q are changed by a multiplying circuit of a high frequency mixer 13 according to a signal output from the first local oscillator 14. The signals I and Q are then output to a high frequency output part (output terminal) 17 from the high frequency mixer 13. otherwise, the frequencies of the signals I and Q are changed by a multiplying circuit of a low frequency mixer 12 according to a signal output from the first local oscillator via an N-divider 15. The signal I and Q are then output to a low frequency output part (output terminal) from the low frequency mixer 12.

At this time, the modulator 11 corresponds to the modulating means and the first local oscillator 14 corresponds to the oscillating means of the present invention respectively. In addition, the N-divider 15 corresponds to the N-dividing means of the present invention.

The phase angles of the signals I and Q entered to the modulator 11 differ 90 degrees from each other.

The dual mode wireless telegraph in this embodiment means a portable terminal that can use two types of portable telephone services for communication systems per unit.

In this embodiment, description will be made for a dual mode wireless telegraph that can use two types of service frequencies (low frequency and high frequency of portable telephones). In addition, the operation of the dual mode wireless telegraph on the following specifications will be described in detail.

The specifications are as follows; the GSM system is assumed for the low service frequency (around 900 MHz) used widely in Europe and the DCS1800 system is assumed for the high frequency side service frequency (around 1800 MHz). The DCS1800 system is an expanded version of the GSM system.

In the above two communication systems, the GSM system uses a lower frequency band than the DCS system. Consequently, when the user selects any one of those systems actually, the dual mode wireless telegraph senses the service frequency for the selected system by itself and sets the low or high frequency service environment automatically. Such a automatic setting of the service environment is realized by the following conventional method.

A transmit signal output from an extension of a portable telephone is transmitted to the base station first to judge whether or not it is possible to make bilateral communications therebetween. For example, at first, communications with the base station are checked in the low frequency mode. If the base station sends back a response, the low frequency mode is continued. If not, the mode is changed to the high frequency one and the high frequency transmitter is started. If communications with the base station are enabled in the high frequency mode, the mode is continued. If not, it is judged that communications are disabled in any mode.

A modulated signal from the modulator 11 is transmitted to both the low frequency mixer 12 and the high frequency mixer 13.

The frequency of a 1800 MHz signal to be entered to the low frequency mixer 16 from the first local oscillator 14 is divided by a factor of N, but the 1800 MHz signal is entered to the high frequency mixer 17 as is. At this time, a signal output from the first local oscillator 14 is entered to the N-divider 15 so that the frequency of the signal is divided into 900 MHz.

In other words, when the above specifications are expected, the frequency of the dual mode wireless telegraph in this embodiment is designed to be N=2. Thus, the 1800 MHz frequency of a signal output from the first local oscillator 14 is divided by a factor of N=2 in the N-divider 15 and entered to the low frequency mixer 12 as a 900 MHz signal. To the high frequency mixer, however, is entered the 1800 MHz signal as is.

A modulated signal from the modulator 11 and the 900 MHz signal from the N-divider 15 are entered to the low frequency mixer 12 such way. Furthermore, a modulated signal from the modulator 11 and the 1800 MHz signal from the first local oscillator 14 are entered to the high frequency mixer 13.

On the other hand, according to the automatic setting function of the service environment described above, for example, when the function is set for the low frequency, the corresponding control signal is transmitted to both the low frequency mixer 12 and the high frequency mixer 13. Consequently, the low frequency mixer 12 runs and the high frequency mixer 13 stops.

Consequently, only the low frequency mixer outputs a signal to the low frequency output part (output terminal) 16.

According to the service environment, signals from either of the low frequency mixer 12 or the high frequency mixer 13 are output to the low frequency output part (output terminal) 16 or the high frequency output part (output terminal) 17 such way.

The dividing number of the frequency from the first oscillator is decided in the designing stage so as not to affect the actual transmission and receiving frequencies, as well as to reduce unnecessary spurious outputs as much as possible. Consequently, the optimal frequency is not necessarily only one.

When the wireless telegraph is provided with at least one N-divider 15 such way, it is possible to generate a plurality of signals on the basis of the signal from the first local oscillator 14.

(Second Embodiment)

Figure 2:
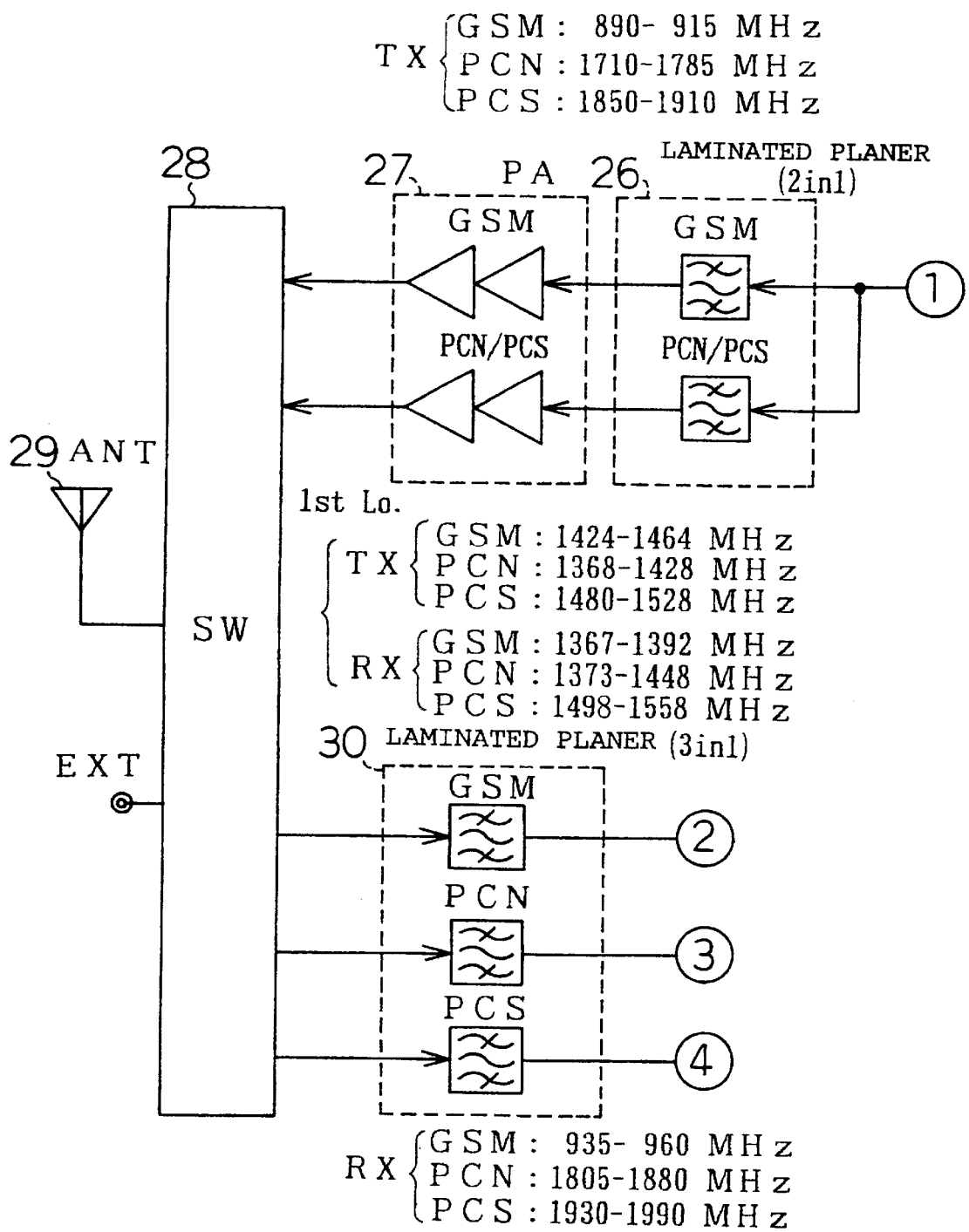
FIG. 2 is a block diagram for the front part of a triple mode wireless telegraph corresponding to a plurality of communication systems in the second embodiment of the present invention.
Figure 3:
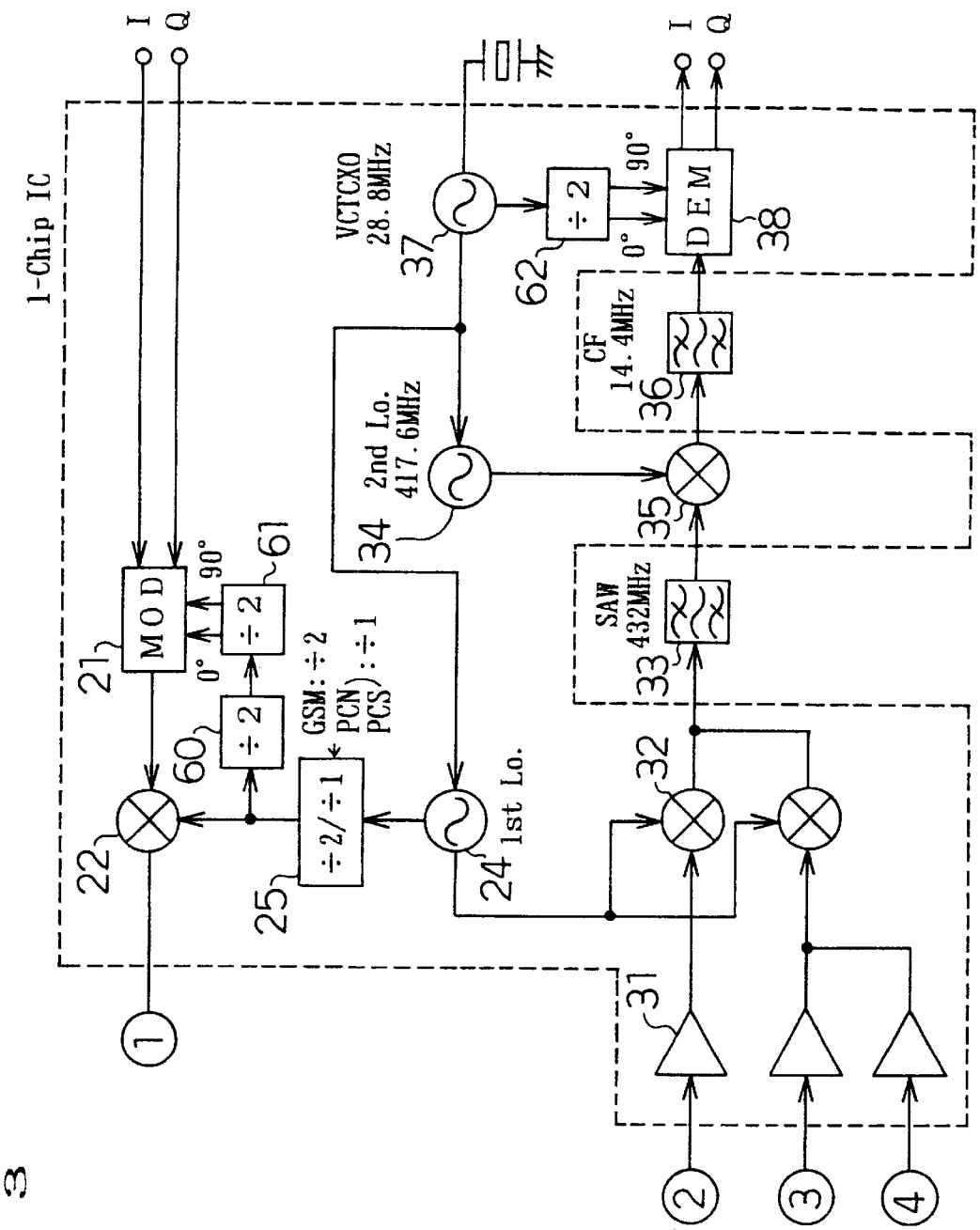
FIG. 3 is a block diagram for the rear part of the triple mode wireless telegraph corresponding to a plurality of communication systems in the second embodiment shown in FIG. 2.

FIGS. 2 and 3 are block diagrams for a triple mode wireless telegraph corresponding to a plurality of communication systems in the second embodiment of the present invention. Although the block diagram of this triple mode wireless telegraph is divided as shown in FIGS. 2 and 3, both diagrams of the telegraph are connected actually to each other at portions indicated with ① to ④ in FIGS. 2 and 3.

This triple mode wireless telegraph is composed on the basis of the dual mode telegraph in the first embodiment, but modified to use the communication system called PCS1900 serviced in the United States of America.

In FIGS. 2 and 3, the transmitter transmits signals I and Q to an input terminal of the modulator 21 that can modulate a plurality of communication signals. Passing the modulator 21, the frequencies of the signals I and Q are changed by a multiplying circuit provided in a transmission mixer 22 according to a signal output from the first local oscillator 24. The signal from the first local oscillator 24 is divided by the N-divider 25 used as variable dividing means. The signals are then output from the mixer 22. The phase angles of the signals I and Q entered to the modulator 21 differ 90 degrees from each other.

The triple mode wireless telegraph in this embodiment is designed so that the oscillating frequency of the first local oscillator 24 becomes 1424 to 1464 MHz when the GSM system is used and 1368 to 428 MHz when the DCS1800 (PCN) system is used. When the PCS1900 system is used, the oscillating frequency becomes 1480 to 528 MHz.

The triple mode telegraph judges the service environment by itself just like in the first embodiment, so that the first local oscillator 24 outputs a signal within the frequency band corresponding to the service environment. The signal is then entered to the mixer 22 via the N-divider as the first local signal.

In other words, if there are three types of service frequencies usable for portable telephones as described above and the GSM system is to be used, then the first local oscillator 24 outputs a signal within a frequency range of 1424 to 1464 MHz and the frequency is then divided by a factor of N=2 in the N-divider 25 and the signal is entered to the mixer 22 as 712 to 732 MHz signals.

If the DCS1800 (PCN) system is used as a high frequency side service frequency, which is about double the above one, the first local oscillator 24 outputs a signal within 1368 to 1428 MHz and the signal is entered to the mixer 22 as the first local signal. The frequency of a 1368 to 1428 MHz signal is not divided at this time.

If the PCS1900 system is used as a service frequency, the first local oscillator 24 outputs a signal within 1480 to 1528 MHz and the signal is entered to the mixer 22 as the first local signal. The 1489 to 1528 MHz signal is not divided at this time.

Hereunder, a comparison will be made between the wireless telegraph in this embodiment, which is composed of two local oscillators 501 and 502 and the wireless telegraph composed of only one first local oscillator with reference to FIG. 5.

In FIG. 5, the same reference numerals are given to the same items as those in this embodiment.

In FIG. 5, the oscillating frequency of the low frequency local oscillator 501 is set to 644 to 669 MHz just like the single mode wireless telegraph corresponding to the conventional GSM system. The oscillating frequency of the high frequency local oscillator 502 is set to 1464 to 1539 MHz or 1604 to 1664 MHz just like the single mode wireless telegraph corresponding to the conventional PCN system or the PCS system.

If a dual mode wireless telegraph that can correspond to two communication modes (GSH and PCN systems) on such conditions is manufactured, however, this frequency oscillator must be used for each of the dual modes. Thus, the wireless telegraph is not reduced so much in any of size and weight.

If those two local oscillators 501 and 502 are replaced with one first local oscillator, the oscillating frequency becomes 644 to 1539 MHz, so a band width of about 900 MHz is needed.

Furthermore, in the case of a triple mode wireless telegraph obtained by adding the PCS system to the dual mode wireless telegraph in the above comparison, if the telegraph is designed so as to use only one first oscillator just like in the above comparison, the oscillating frequency becomes 644 to 1664 MHz, so a band width of 1 GHz is needed.

According to the result of the above comparison, it will be found that it is not practical to design the portable terminal in the above comparison so as to use only one oscillator when the C/N degradation of electrical characteristics is taken into consideration in such a wide range band width.

On the contrary, if the GSM system is used as the low frequency side service frequency and the PCN system and the PCS system are used as the high frequency side service frequencies just like the triple mode portable terminal in this embodiment, the oscillating range required by one first local oscillator is 1368 to 1528 MHz.

In this case, the oscillating frequency of the first local oscillator 24 is about 150 MHz in band width. When compared with the configuration of the portable terminal that uses no divider in the above comparison, the oscillating frequency band width is reduced only to about 1/10.

Consequently, the portable terminal is not affected by the expected degradation of the electrical characteristics so much. In addition, the number of oscillators can be reduced, so that the portable terminal becomes more compact in size and light in weight than the conventional one.

If it is considered to use a dual mode portable terminal that can correspond to both GSM and PCS systems as a variation of the dual mode portable terminal described in the first embodiment, the GSM system should be used for the low frequency side service frequency and the PCS system should be used for the high frequency side service frequency. Consequently, only one first local oscillator 14 can cope with an oscillating frequency range within 1424 to 1528 MHz. It is thus only needed to provide the band width with about 100 MHz.

On the other hand, in FIG. 3, signals to be entered to the transmission modulator 21 are two signals whose phase angles are divided into two parts respectively in the phase signal generator 61 so that their phase angles differ 90 degrees from each other. Those two signals are generated by dividing the frequency output from the first local oscillator 24 using a factor of N in the N-divider 25 according to a frequency corresponding to the result of the above automatic detection of a service environment, then dividing the frequency further by a factor of M in the M-divider. The N and M in this case are real numbers over 1 respectively. In this embodiment, the M is assumed to be 2.

Concretely, when the high frequency side service frequency is to be used, the N value of the divider 25 is set to 1. When the low frequency side service frequency is to be used, the N value is set to 2. The M-divider 60 and the phase signal generator 61 correspond to the phase signal generating means for modulation of the present invention.

If a signal of the above frequency is entered to the mixer 22, the mixer 22 outputs a frequency as shown below according to the communication system in use.

If the GSM system is used, the frequency range is within 890 to 915 MHz and when the DCS1800 system is used, the frequency range is within 1710 to 1785 MHz. When the PCS1900 system is used, the frequency range is within 1850 to 1910 MHz.

Concretely, when the GSM system is used, the frequency of a signal output from each device will be as shown below.

The output from the M-divider 60 is within 356 to 366 MHz. The M-divider 60 divides a signal of 712 to 732 MHz output from the N-divider 25 by a factor of M=2. The phase signal generator 61 divides a signal output from the M-divider 60 by a factor of 2. The output from the phase signal generator 61 to the modulator 21 is within 178 to 183 MHz. Consequently, the mixer 22 receives a signal of 890 to 915 MHz, which is obtained by adding a signal of 712 to 732 MHz output from the N-divider to a signal of 178 to 183 MHz output from the modulator 21. The above outputs are also obtained even when other systems are used.

Each of the above signals, which is appropriate to each service, is transmitted to the power amplifier (PA) 27 used as a transmission amplifier via a transmission band-pass filter of the laminated planer 26. The signal is amplified there and transmitted from a terminal of the antenna 29 via the antenna switch 28.

The same filter of the laminated planer 26 is also used for both DSC1800 and PCS1900 systems, since frequencies of those systems (high frequencies) are close to each other. For the low frequency GSM system, a single filter unit is used. Since the laminated filter, which is a one-package filter, can be divided into two parts so as to have two passing band widths, the wireless telegraph can be reduced in both size and weight more significantly.

The power amplifier 27 is also divided into two parts to cope with the frequency configuration of the wireless telegraph. The low frequency side GSM signal amplifier, the high frequency side PCN or PCS signal amplifier are housed in one package with a passage therebetween.

When in receiving, if a desired signal is received via a terminal of the antenna 29, the received signal passes the antenna switch 28. The signal then passes the laminated planer 30, which is the first receiving band-pass filter for each of the GSM, PCN, and PCS signals. The signal is then entered to the low noise power amplifier 31 (LNA) used as a receiving amplifier to be amplified there, so that only the signal necessary to receive GSM, PCN, and PCS signals is amplified. For example, when receiving a GSM signal, the received signal frequency of the antenna 29 is set to 935 to 960 MHz and only the frequency that can pass the receiving mixer 32 is set to 432 MHz. In addition, a SAW filter 33 is used. The SAW filter 33 is a band-pass filter provided with sharp frequency characteristics and an excellent selectivity. If the passing frequency is set to 432 MHz, the frequency of the received first local signal becomes 1367 to 1392 MHz and a received signal (935 to 960 MHz) is subtracted from the frequency 1367 to 1392 MHz in the receiving mixer 32 thereby to obtain a 432 MHz received signal.

Next, if 14.4 MHz is set for the ceramic filter (CF), which is the second band-pass filter that passes lower frequencies than the receiving band-pass filter, then the oscillating frequency of the second local oscillator becomes 417.6 MHz, which is obtained by subtracting 14.4 MHz from 432 MHz.

In order to receive the signals I and Q, a voltage-controlled oscillator with temperature compensation (VCTCXO) 37 is used. The oscillator can obtain 28.8 MHz easily, which is double the 14.4 MHz frequency of the ceramic filter. Consequently, a 2-divider 62 is provided between the voltage-controlled oscillator with temperature compensation 37 and the demodulator 38. And, the phase generated in this 2-divider 62 is used to demodulate the signals I and Q in the demodulator 38 according to the two phase signals that differ 90 degrees from each other.

Although the GSM frequency is picked up in the above description, if PCN frequency or the PCS frequency may also be picked up. If the PCN frequency or the PCS frequency is picked up, the passing frequency of the SAW filter 33 becomes 432 MHz just like the GSM system case after passing each laminated planer that passes signals of the PCN and PCS bands via the antenna 29 and being amplified in each low noise power amplifier 31. For the PCN frequency, the frequency of received first local signal becomes 1373 to 1448 MHz and for the PCS frequency, the frequency of received first local signal becomes 1498 to 1558 MHz. Thus, the received signal frequency becomes 432 MHz if the frequency is subtracted in the receiving mixer 32 respectively. Thereafter, received signals are the same as those of the GSM system.

In this embodiment, this received first local frequency is set almost equally to the transmission side frequency described above, so only one oscillator can be used for both transmission and receiving. In addition, the same oscillator is also set so as to correspond to both low and high frequencies. Consequently, it is possible to reduce the number of parts, as well as both size and weight of the wireless telegraph significantly.

Furthermore, in this embodiment, the frequency of the receiving SAW filter 33 is set to 432 MHz, the frequency of the ceramic filter 36 is set to 14.4 MHz, the frequency of the second local oscillator for transmission 34 is set to 417.6 MHz, and the frequency of the voltage-controlled oscillator with temperature compensation 37 is set to 28.8 MHz respectively for manufacturing the wireless telegraph.

In the above embodiment, if it is possible to integrate all of the devices of the portable terminal in an integrated circuit mounted on a frame substrate so that the wireless telegraph is formed as one chip, both size and weight of the portable terminal will be reduced more significantly. The devices to be included in the above integrated circuit are the modulator 21, the transmission mixer 22, the first local oscillator 24, and the divider 25 in the transmit signal frequency changer, as well as a plurality of the low noise amplifiers 31 provided to correspond to a plurality of communication systems, the second local oscillator 34, the receiving mixers 32 and 35, the demodulator 38, and the voltage-controlled oscillator with temperature compensation 37 in the receiver.

(Third Embodiment)

Figure 4:
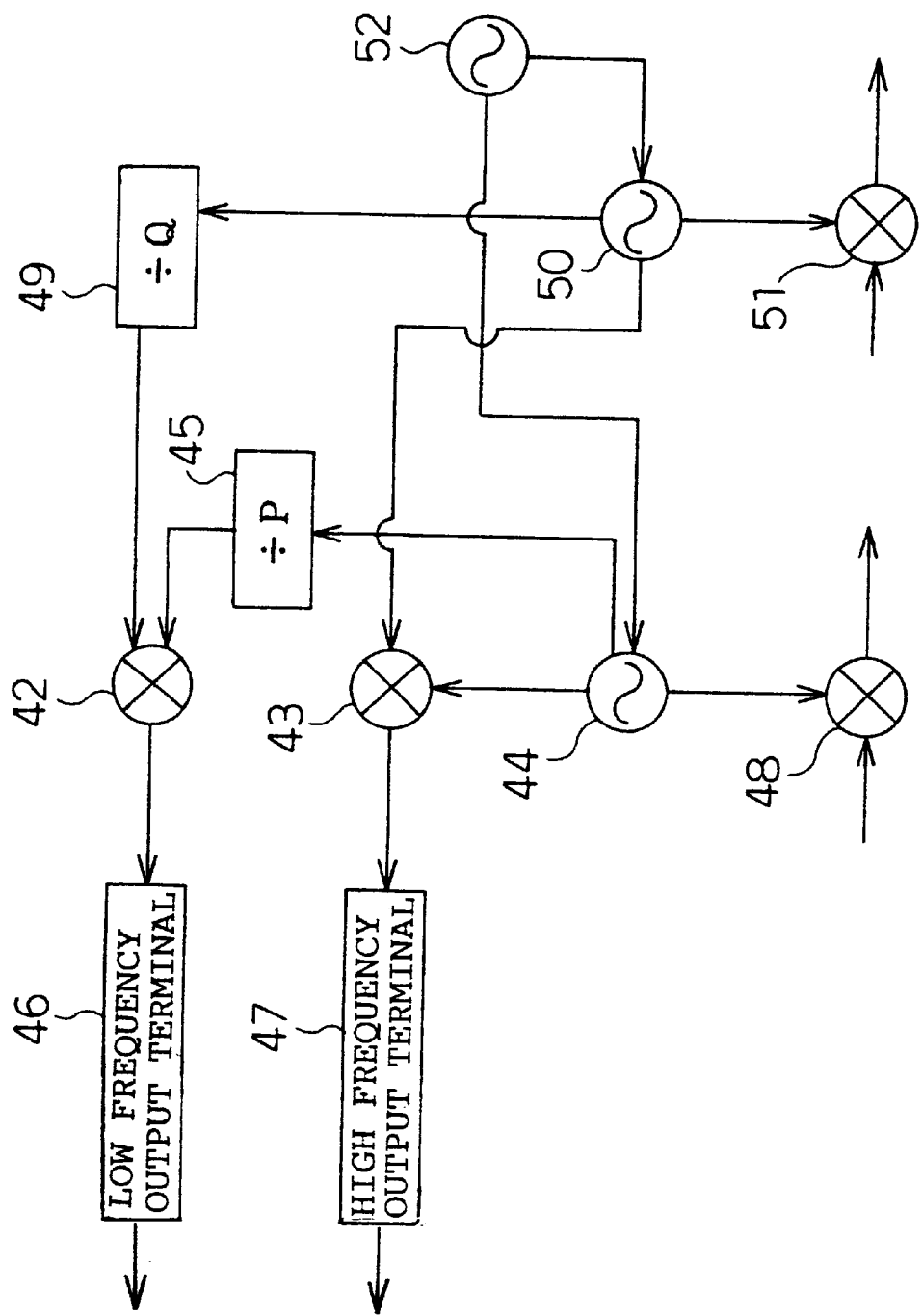
FIG. 4 is a block diagram for the major portion of a dual mode wireless telegraph corresponding to a plurality of communication systems in the third embodiment of the present invention.

FIG. 4 is a schematic block diagram for the transmission side of a dual mode wireless telegraph corresponding to a plurality of communication systems in the third embodiment of the present invention.

In this embodiment, description will be made for a frequency configuration in which the transmission frequencies from the portable terminal are as follows; the low frequency side service frequency is the second frequency within 880 to 915 MHz, and the high frequency side service frequency is the first frequency within 1985 to 2015 MHz. In other words, the first frequency is double or close to double the second frequency.

In FIG. 4, the P-divider 45 divides the first local frequency 1546 MHz output from the first local oscillator. Since P=2 is set in this embodiment, the P-divider enters a signal within 773 to 808 MHz to the low frequency mixer, which is the second mixer.

As for the second local frequency, the 428 MHz signal output from the second local oscillator 50 is transmitted to the Q-divider. Since Q=4 is set in this embodiment, the output of the Q-divider 49 becomes 107 MHz, which is entered to the low frequency mixer 42. The frequency is multiplied by 773 to 808 MHz entered from the P-divider as described above thereby to obtain a signal whose frequency is 880 to 915 MHz. The signal is then output from the low frequency output part (output terminal) 46.

Furthermore, a signal within 1557 to 1587 MHz output from the first local oscillator 44 is entered to the high frequency mixer 43 used as the first mixer without passing the P-divider 45. A 428 MHz signal output from the second local oscillator 50 is entered to the high frequency mixer 43 without passing the Q-divider 49. A 1985 to 2015 MHz signal obtained by multiplying 1557 to 1587 MHz by 428 MHz is output from the high frequency output part (output terminal) 47.

The mixer 48, which receives a signal from the first local oscillator, is the first mixer for receiving and the mixer 51 that receives a signal from the second local oscillator 50 is the second mixer for receiving.

Signal sources used for this circuit configuration can also be used for all the encoded modulated signal systems such as CDMA included in a sine wave and a band width.

As described above, in the present invention's wireless telegraph corresponding to a plurality of signals, one portable telephone can transmit and receive signals from and to a plurality of portable telephone systems. And, the size and weight of the portable telephone is still as small as one conventional portable telephone.

In the first embodiment, description is made for both configuration in which a signal is entered to the low frequency mixer 12 via the N-divider 15 and configuration in which a signal is entered to the high frequency mixer 13 without passing the N-divider 15. In other words, two mixers are provided in the embodiment. However, the configuration is not limited only to those two ones. For example, like the configuration described in the second embodiment, only one transmission mixer 22 may be provided (see FIG. 3) as a variation of the first embodiment. Consequently, since the number of mixers can be reduced to only one, the size of the portable terminal can be reduced more significantly.

What is claimed is:

1. A multi-mode wireless system comprising means for modulating I and Q signals from each of a plurality of communication systems and outputting a modulated signal;

first oscillating means for outputting an oscillated signal of a first predetermined frequency;

dividing means for adjustably dividing said oscillated signal in response to each of said plurality of communication systems to output a divided signal;

a mixer for mixing said divided signal and said modulated signal and outputting a signal of a second predetermined frequency;

a transmission band-pass filter for passing the signal of said second predetermined frequency;

a transmission amplifier for amplifying the signal of said second predetermined frequency after passing said transmission band-pass filter;

a first receiving band-pass filter for passing a received signal;

a receiving amplifier for amplifying said received signal after passing said first receiving band-pass filter and outputting an amplified received signal;

a first receiving mixer for mixing said amplified received signal and said oscillated signal and outputting a first intermediate frequency signal;

a second receiving band-pass filter for passing said first intermediate frequency signal;

means for generating two signals whose phases differ by 90 degrees from each other by further dividing said divided signal output from said dividing means;

second oscillating means for oscillating a signal of a frequency different from that of said first predetermined frequency;

a second receiving mixer for mixing a signal from said second oscillating means and a signal that has passed said second receiving band-pass filter, and outputting a second intermediate frequency signal;

a third receiving band-pass filter for passing the second intermediate frequency;

means for demodulating I and Q signals from signals that have passed said third receiving band-pass filter;

a voltage-controlled oscillator; and means for generating phase signals whose phases differ by 90 degrees from each other from an output signal of said voltage-controlled oscillator, and providing said phase signals to said demodulating means.

2. A multi-mode wireless system according to claim 1, wherein at least one of said transmission band-pass filter and said first receiving band-pass filter is a laminated planer type filter for passing a signal in each frequency band of said plurality of communication systems.

3. A multi-mode wireless system according to claim 2, wherein said transmission band-pass filter is divided into a high frequency band part and a low frequency band part and said high frequency band part corresponds to DCS1800 and/or PCS1900 and said low frequency band part corresponds to GSM.

4. A multi-mode wireless system according to claim 2, wherein
said first receiving band-pass filter includes band-pass filters, each of which corresponds to one of a high frequency band DCS1800, a high frequency band PCS1900, and a low frequency band GSM.

5. A multi-mode wireless system according to claim 1, wherein
said modulating means, said first oscillating means, said dividing means, said transmission mixer, said receiving amplifier, said first receiving mixer, said modulation phase signal generating means, said second oscillating means, said second receiving mixer, said demodulating means, said voltage-controlled oscillator, and said demodulation phase signal generating means are included in an integrated circuit.

6. A multi-mode wireless system according to claim 1, wherein
said second receiving band-pass filter is a SAW filter and said third receiving band-pass filter is a ceramic filters each manufactured independently.

7. A multi-mode wireless system according to claim 6, wherein
a frequency of said SAW filter is 432 MHz and a frequency of said ceramic filter is 14.4 MHz.

8. A multi-mode wireless system according to claim 1 wherein
a frequency of said second oscillating means is 417.6 MHz and a frequency of said voltage-controlled oscillator is 28.8 MHz.

9. A multi-mode wireless system according to claim 1, wherein a frequency range of said first local oscillator is 1424 to 1464 MHz for GSM, 1368 to 1428 MHz for DCS1800, and 1480 to 1528 MHz for PCS1900, and a signal from said first local oscillator is provided to said transmission mixer via an N-divider.

10. A multi-mode wireless system for transmitting two transmission frequencies, wherein a first frequency is substantially double of a second frequency, comprising
a first local oscillator for oscillating a signal of a first local frequency;
a P-divider for dividing said first local frequency signal by a factor of P;
a second local oscillator for oscillating a signal of a second local frequency;
a Q-divider for dividing said second local frequency signal by a factor of Q;
a first mixer for receiving said first and second local frequency signals and outputting a signal at said first frequency; and
a second mixer for receiving said P-divided first local frequency signal and said Q-divided second local frequency signal and outputting a signal at said second frequency.

11. A multi-mode wireless system according to claim 10, wherein a frequency range of said first local oscillator is 773 to 808 MHz for GSM and 1557 to 1587 MHz for communication systems other than said GSM.

12. A multi-mode wireless system comprising
a modulator for modulating signals from each of a plurality of communication systems and outputting a modulated signal;
a first oscillator for outputting a first predetermined frequency signal;
a first divider for adjustably dividing said first predetermined frequency signal in response to each of said plurality of communication systems and outputting a first divided signal;
a second divider for dividing said first divided signal and outputting a second divided signal to said modulator, wherein the modulator modulates the signal from each of the plurality of communication systems with said second divided signal to output said modulated signal;
a mixer for mixing said first divided signal and said modulated signal and outputting a second predetermined frequency signal;
a transmitter for transmitting said second predetermined frequency signal;
a first receiving mixer for mixing a received signal and said first predetermined frequency signal and outputting a first intermediate frequency signal; and
a demodulation circuit for demodulating said first intermediate frequency signal from each of said plurality of communication systems to provide a demodulated signal.

13. The multi-mode wireless system of claim 12 wherein the demodulation circuit includes;
a second oscillator for outputting a third predetermined frequency signal, the third predetermined frequency signal being different from the first predetermined frequency signal;
a second receiving mixer for mixing said third predetermined frequency signal with said first intermediate frequency signal and outputting a second intermediate frequency signal; and
a demodulator for demodulating said second intermediate frequency signal to provide said demodulated signal.

* * * * *